United States Patent
Byatt et al.

(10) Patent No.: US 6,318,172 B1
(45) Date of Patent: Nov. 20, 2001

(54) CAPACITIVE LEVEL DETECTOR WITH OPTIMIZED ELECTRODE GEOMETRY

(75) Inventors: John Anthony Byatt, Klingnau; Thomas Christen, Vogelsang; Thomas Kleiner, Rieden-Nussbaumen; Daniel Matter, Brugg; Walter Ruegg, Endingen, all of (CH)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 09/341,798

(22) PCT Filed: Dec. 24, 1997

(86) PCT No.: PCT/CH97/00483
§ 371 Date: Oct. 5, 2000
§ 102(e) Date: Oct. 5, 2000

(87) PCT Pub. No.: WO98/33044
PCT Pub. Date: Jul. 30, 1998

(30) Foreign Application Priority Data

Jan. 28, 1997 (DE) .............................. 197 04 975
Mar. 29, 1997 (DE) .............................. 197 13 267

(51) Int. Cl.⁷ .................................. G01F 23/26
(52) U.S. Cl. ........................... 73/304 C; 361/284
(58) Field of Search ................ 73/304 R, 304 C; 361/284, 286

(56) References Cited

U.S. PATENT DOCUMENTS

| | | | |
|---|---|---|---|
| 3,644,821 | * 2/1972 | Long | 324/61 R |
| 4,795,967 | * 1/1989 | Fredericks | 324/61 P |
| 4,806,847 | * 2/1989 | Atherton et al. | 324/61 P |
| 5,477,727 | * 12/1995 | Koga | 73/304 C |
| 5,739,598 | * 4/1998 | Zatler et al. | 307/652 |
| 6,073,488 | * 6/2000 | Byatt et al. | 73/304 C |
| 6,125,696 | * 10/2000 | Hannan et al. | 73/304 C |
| 6,138,508 | * 10/2000 | Hannan et al. | 73/304 C |

FOREIGN PATENT DOCUMENTS

| | | |
|---|---|---|
| 2819731 | 12/1979 | (DE) . |
| 3812687A1 | 10/1989 | (DE) . |
| 0149279A2 | 7/1985 | (EP) . |
| 0538182A1 | 4/1993 | (EP) . |
| WO92/21944 | 12/1992 | (WO) . |

\* cited by examiner

Primary Examiner—Hezron Williams
Assistant Examiner—Willie Morris Worth
(74) Attorney, Agent, or Firm—Burns, Doane, Swecker & Mathis, L.L.P.

(57) ABSTRACT

The subject matter of the present invention is the optimization of a capacitive liquid level sensor which is suitable, in particular, for determining the location of a boundary layer 12 between water 10 and oil 11 in a separator tank. The known sensor principle is based on measuring the environmentally dependent capacitance between neighboring electrodes 13, 4; 4, 5; 5, 6 of a rod-shaped probe 1. According to the invention, the probe 1 is designed such that large ionic double-layer capacitors occur on the electrodes 4, 5, 6, 13 in the more conductive medium 10, and small capacitors occur between electrodes 4, 5, 6, 13 in the insulating medium 11. For this purpose, the electrode height h is selected to be large, the ratio of the electrode height h to the electrode spacing a is preferably selected to be in the range of $1 < h/a < 6$ and, in particular, the measuring frequency f is selected to be in the dielectric cut-off frequencies of the media 10, 11. As a result, it is possible to achieve a large jump in capacitance for a digital liquid level display and/or a largely continuous increasing capacitance for an analog liquid level display. Furthermore, the influence of more conductive and/or insulating dirt films 14 on the capacitance signal is eliminated by suitable measuring frequencies and/or by radially offsetting the electrodes 4, 5, 6, 13.

18 Claims, 7 Drawing Sheets

CAPACITIVE LEVEL DETECTOR WITH OPTIMIZED ELECTRODE GEOMETRY

BACKGROUND OF THE INVENTION

1. Field of the Invention

The invention relates to the field of liquid level displays. It proceeds from a capacitive liquid level sensor according to the preamble of claim 1.

2. State of the Art

A multiplicity of devices which are based on very different physical measuring principles are known in the prior art for determining the liquid level of a container. These principles comprise electric (capacitive or resistive) and optical methods, radar reflection methods, ultrasound echo-time methods and gamma absorption methods.

In offshore crude oil recovery, use is made of so-called separation tanks in which the various phases (sand, water, oil and gas) occurring during drilling or conveyance are separated on the basis of their differences in density and led off into separate pipe systems. It is very important in this case to know the height of the separating layer between the water and oil, in order to be able to open and close the drain valves of the two media on the tank in a controlled fashion. This requires reliable liquid level measuring instruments. If such a liquid level measuring instrument does not function, or functions incorrectly, it is possible, for example, for oil to pass into the water outlet and cause severe environmental damage and high costs.

Recently, high-pressure separation tanks have been developed which are suitable for operation on the sea floor a few 100 m below the surface of the sea. The conveyed and already separated oil can then be pumped to the surface of the sea with a much lower expenditure of energy. Such separator tanks are exposed to very high pressures of 60–180 bar, specifically, from outside, to the water pressure at the seabed and, from inside, to the pressure of the conveyed crude oil, and to high temperatures of 50–120° C. The liquid level measuring system must function for years without maintenance and reliably under these difficult conditions, since an operational failure and premature replacement would entail high costs.

The prior art discloses multifarious electrode arrangements for capacitive measurement of the electrode environment, and thus for determining the liquid level. For example, rod-shaped measuring probes are proposed which have a plurality of electrodes arranged along a probe axis and make use, in particular, of the large discontinuity in the dielectric constant at the boundary layer between oil and water. A disadvantage of the known measuring probes is that the spatial resolution is limited by the periodicity of the electrode arrangement, and that liquid levels situated between cannot be measured. Again, it is not possible to detect boundary layers between media having the same dielectric constants. For media of different conductivity, it is known to measure the ohmic discharge currents between individual electrodes in order to locate the boundary layer. This requires a measuring frequency to be selected to be so low that the ohmic current dominates the capacitive one in both media. However, it has not so far been taken into account that the conductivity of the media can greatly influence the field distribution between the electrodes, and thus the magnitude of the capacitances.

Soiling of the measuring probe by the media to be measured constitutes a serious problem for the measuring accuracy and reliability of such liquid level sensors. For example, a conductive water film can interfere with or render impossible the detection of an oil medium, and a non-conducting oil coating can do the same for the detection of a water medium.

DE 28 19 731 discloses a capacitive sensor which serves to monitor the limiting value of an adhesive, conductive medium. The capacitance is measured between a rod-shaped probe and the container wall. It is possible for conductive deposits on the probe and the wall to cause fault currents which are picked up by a shield electrode along the probe axis. The fault currents can also be kept small by means of measuring frequencies which are as high as possible. A disadvantage of this arrangement consists in that the liquid level height cannot be measured continuously.

DE 38 12 687 A1 presents a capacitive sensor for simultaneously determining the liquid level and the water content of a liquid which is at least weakly conductive. For this purpose, two coaxially arranged electrodes are dipped into the medium and the complex impedance is measured at at least two frequencies. The capacitive reactance is a measure of the liquid level, and the ohmic effective resistance is a measure of the conductivity of the medium.

None of the above-named sensors takes account of the fact that the measurement of capacitance in conductive media is influenced by ionic charge transport, from which new possibilities arise for optimizing the electrode geometry. Furthermore, it has not so far been possible to eliminate the disturbing influence of insulating dirt coatings on the measuring probe.

SUMMARY OF THE INVENTION

It is an object of the invention to provide a capacitive liquid level sensor having a large signal amplitude and/or a largely continuous measuring range. This object is achieved according to the invention by means of the features of claim 1.

The core of the invention is, specifically, to equip a rod-shaped probe with a plurality of electrodes arranged along the probe axis, a ratio of electrode height to electrode spacing being selected which is greater than one.

A first exemplary embodiment exhibits a measuring probe in which, by optimizing the electrode height, the capacitance between neighboring electrodes is selected to be large for conductive media, and to be small for insulating media.

A second exemplary embodiment represents a variant in which the electrode height is selected to be as large as possible, in order to realize a largely continuous measuring range.

In a third exemplary embodiment, it is shown how it is possible to use suitable measuring frequencies to detect conductive dirt films on the probe and to eliminate their influence on the capacitance signal.

Finally, it is shown in a fourth exemplary embodiment how radially offset electrodes can be used to detect insulating dirt films on the probe and to eliminate their influence on the capacitance signal.

Additional exemplary embodiments emerge from the dependent claims and from the combination of features essential to the invention.

Important advantages of the capacitive liquid level sensor according to the invention relate to the high measuring accuracy over a large liquid level range, the possibility of digital or analog liquid level display, and the reduced vulnerability in the case of soiling.

A further important advantage consists in that all measures by means of which the capacitance signal and the measuring range are maximized and the disturbing influences due to conductive and insulating dirt films are minimized can be effectively compatible with one another.

Moreover, the simple, robust design without moving parts, the high degree of freedom from maintenance and the outstanding suitability of the measuring probe for detecting a boundary layer between water and oil are advantageous.

BRIEF DESCRIPTION OF THE DRAWINGS

The invention is described in the following with reference to preferred embodiments, wherein.

In the figures, identical parts are represented by identical reference numerals.

DESCRIPTION OF THE PREFERRED EMBODIMENTS

In an earlier German patent application (File reference 197 13 267.7) of the applicant, which is not a prior publication, capacitive liquid level sensor is proposed which is suitable, in particular, for sensitively detecting changes in the dielectric constant of the ambient medium. The rod-shaped, intrinsically closed measuring probe bears along the axis a plurality of electrodes which are in the shape of a ring or torus and partially segmented in the longitudinal direction. The stray capacitance is preferably measured between neighboring electrodes. The capacitance signals of the electrode pairs can be used individually for a digital liquid level display, or in an averaged fashion for an analog liquid level display. In both cases, the spatial resolution is limited by the periodicity of the electrode arrangement. Again, several measures are proposed for keeping small, or eliminating measured-value falsifications owing to soiling of the probe. For example, the probe can be specifically designed for measuring in the near and far zones: the stray capacitances are a measure for the near zone of the measuring probe when the electrodes are of large area and/or widely spaced apart, and a measure for the far zone when the electrodes are of small area and/or closely spaced apart. However, it is disadvantageous that the optimum electrode geometry is specified only with regard to the range of the stray fields in dielectric media and, moreover, only quanlitatively. Finally, the far zone can also be effectively detected by capacitance measurements between the probe and an additional counterelectrode, for example the container wall. Furthermore, the near zone can be measured in conductive media because of the skin effect. However, for penetration depths in the mm range, there is a need for very high frequencies, in the case of water, for example, 10 GHz and above.

Figure 1A:
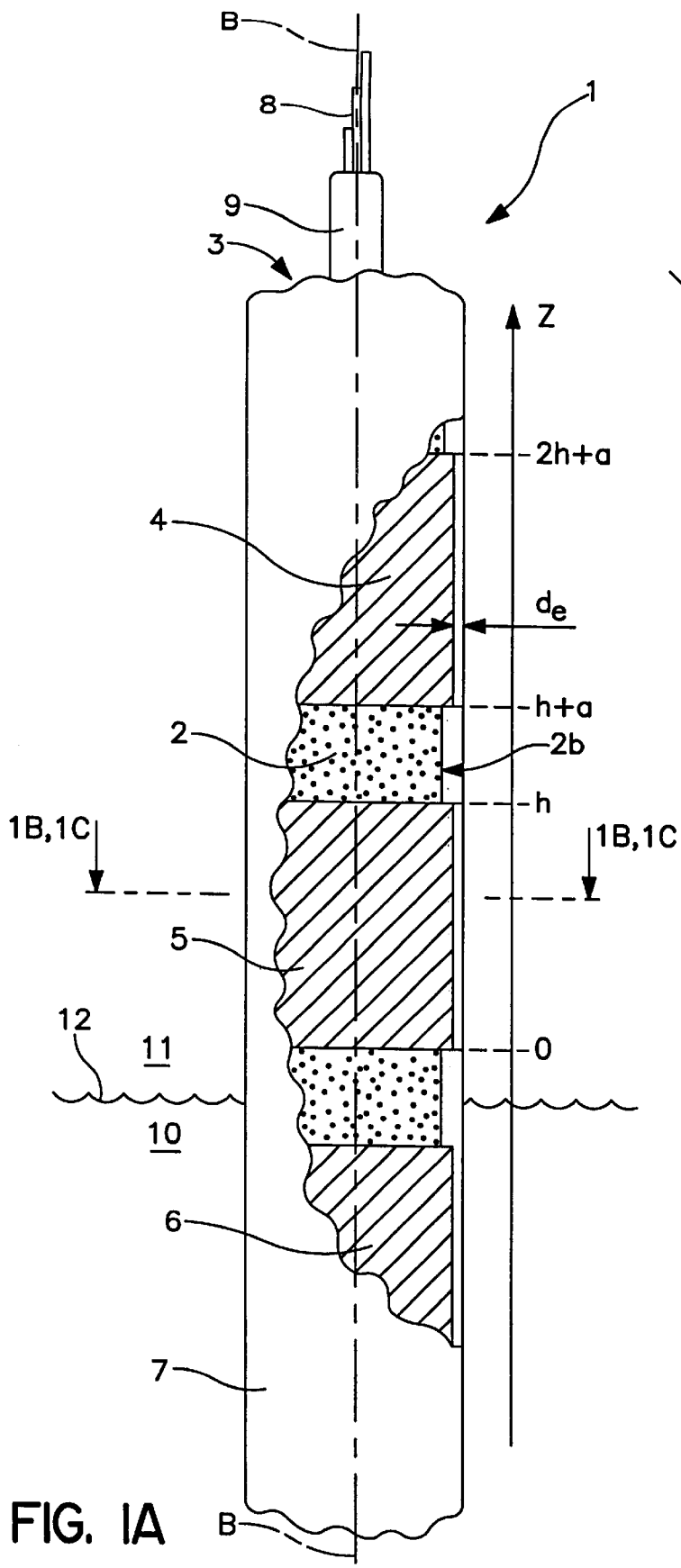
FIG. 1A shows a capacitive measuring probe having a plurality of electrodes, arranged one above another.

The subject matter of the present invention is the optimization of a capacitive liquid level sensor, which is particularly suitable for determining the location of a boundary layer 12 between water 10 and oil 11 in the separator tank. Referring now to the drawings, wherein like reference numerals designate identical or corresponding parts throughout the several views, FIG. 1(a) shows, in a detail, a side view of a liquid level sensor according to the invention, and FIGS. 1(b), (c) show exemplary embodiments for a round and rectangular sensor cross section. The capacitive liquid level sensor comprises a rod-shaped probe 1 having a plurality of electrodes 4, 5, 6, 13, which are arranged along a probe axis B and are connected via measuring lines 8 to an electronic measuring system (not represented). The principle mode of operation is based on measuring between neighboring electrodes 13, 4; 4, 5; 5, 6 the change in capacitance which is caused by a shift in a boundary layer 12 between a conductive medium 10 and an insulating one 11.

Figure 1B:
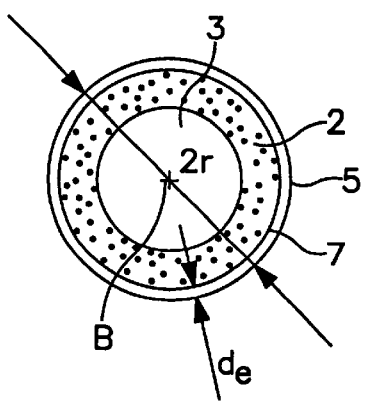
FIG. 1B shows a round cross section of the probe shown in FIG. 1A.
Figure 1C:
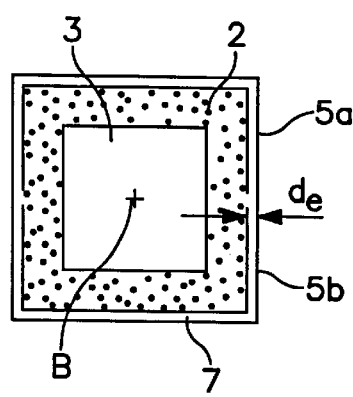
FIG. 1C shows a square cross section of the probe shown in FIG. 1A.

In accordance with FIG. 1a, the measuring probe 1 essentially comprises a cylindrical, electrically insulating tube 2 on whose outer lateral surface 2b the electrodes 4, 5, 6, 13 are mounted. The tube interior 3 is sealed with respect to the outside surrounding the probe 1. The electrodes 4, 5, 6, 13 are preferably provided with an electrically insulating, thin cover 7, which protects the electrodes 4, 5, 6, 13 against mechanical and/or chemical environmental influences. The probe 1 can have any cross section. The tube 2 is preferably a circular cylinder, and the electrodes 4, 5, 6, 13 are in the shape of a ring (FIG. 1b). It is also possible for segment-shaped (FIG. 1c) electrodes 5a, 5b to be interconnected to form a single electrode 5.

For the purpose of analyzing and optimizing the electrode geometry, the invention proceeds from the essential finding that the discontinuity in the conductivity at the boundary layer 12 principally changes the geometry of the participating capacitors, and thus the total capacitance between neighboring electrodes, that is to say the electrode-pair capacitance C.

Figure 2:
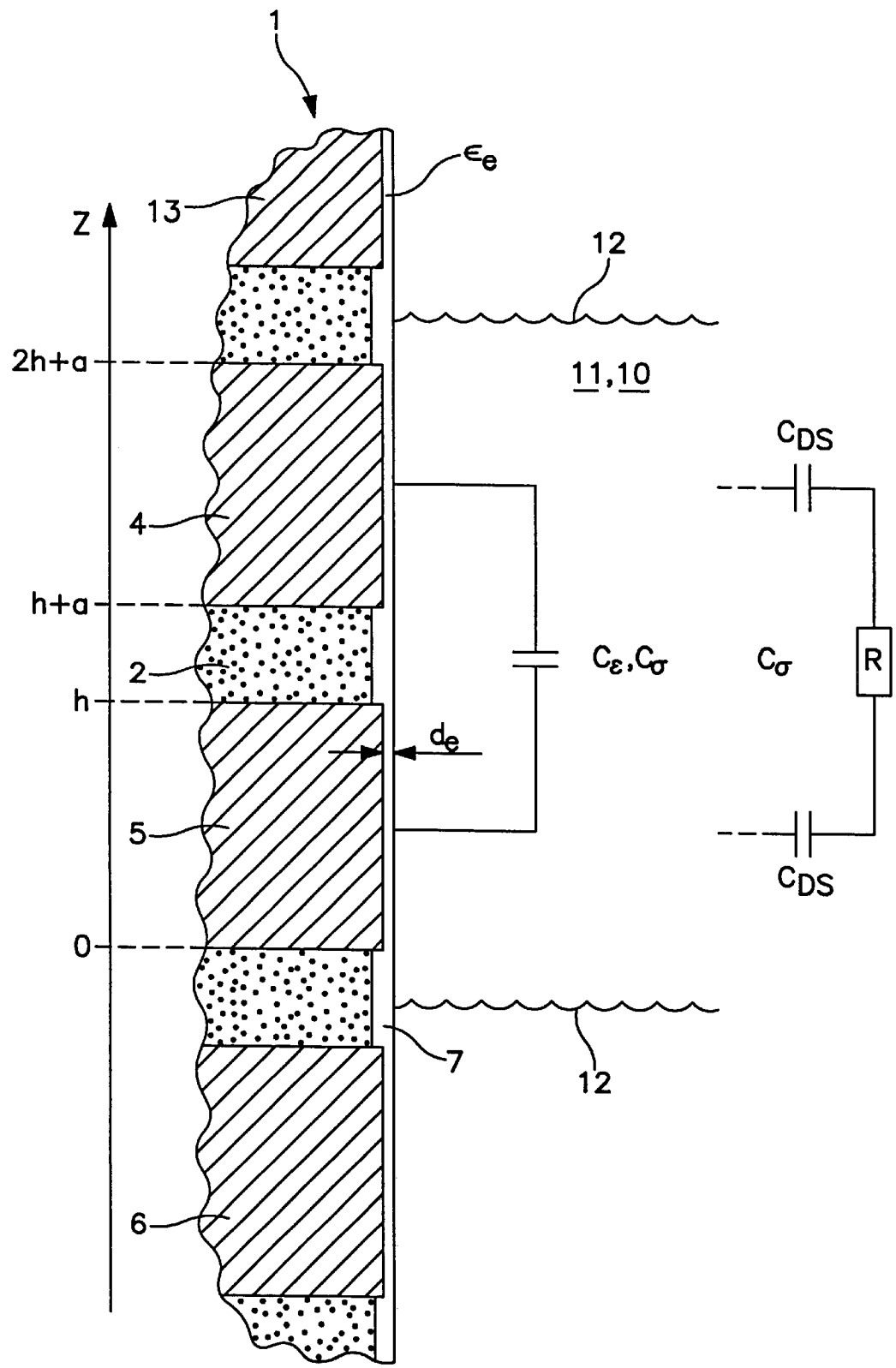
FIG. 2 shows a detail of the measuring probe in accordance with FIG. 1A, with equivalent circuit diagrams for the impedance between an electrode pair.

FIG. 2 represents a detail of the measuring probe 1 with an equivalent circuit diagram, modeled in accordance with the invention, for the complex total capacitance between the electrodes 4 and 5. In the insulating medium 11, the stray capacitance $C_\in$ is dominant; it is given by the geometry of electrodes 4 and 5 and the dielectric constant of the medium 11 and of the rod material, and is calculated with the aid of a finite-element program in any specific case. By contrast, a simple analytical representation is possible in a conductive medium 10. In the immediate vicinity of the electrodes 4, 5 charges are induced and very large double-layer capacitors $C_{DS}$ are formed which are interconnected via the resistance R of the medium 10 and form a complex total capacitance of $$C_o = C_{DS}/[2 \cdot (1 + i \cdot \omega \cdot \tau)] \tag{G1}$$

Here, i denotes the imaginary unit, $\omega = 2\pi \cdot f$, f=frequency of the capacitance measurement, and $\tau$=RC time constant of the double-layer capacitor or the dielectric relaxation time of the RC circuit.

The double-layer capacitance is $$C_{DS} = \epsilon_e \cdot \epsilon_0 \cdot A/d_e, \qquad (G2)$$

where $\epsilon_e$=dielectric constant and $d_e$=thickness of the dielectric electrode cover 7, $\epsilon_0$=influence constant and A=double-layer capacitor surface=surface of the associated electrode (4, 5, 6, 13 including cover 7). $C_{DS}$ is thus given by the effective thickness $d_e/\epsilon_e$ of the electrode cover 7 and the surface of the electrode 4, 5, 6, 13, but depends on the dielectric constant of the conductive medium 10.

The dielectric relaxation time $\tau$ is a measure of the speed with which the double-layer capacitor is charged or formed. It is possible for $\tau$ to be written in the form of $$\tau = R \cdot C_{DS}/2 = \tau_0 \cdot K = \epsilon_e \cdot \rho_M \cdot K \qquad (G3)$$

where $$K = (A/A_f) \cdot (h/d_e) \qquad (G3')$$

where $\rho_M$=resistivity of the medium 10, K=dimensionless geometry factor, $A_f$=effective surface through which current flows, and h=electrode height. Typical values for the geometry factor are 1<K<100.

One goal of the invention is to specify those electrode arrangements for which the electrode-pair capacitance $C_o$ is as large as possible for a conductive medium 10, and $C_\in$ is as small as possible for an insulating medium 11. In the interests of simplicity, it is assumed for the quantitative analysis that the electrodes 4, 5, 6, 13 have a rectangular shape of height h and length $2 \cdot \pi \cdot (r-d_e)$ in a rolled-out state, and that because $d_e \ll r$, the capacitor surface is therefore $A = 2 \cdot \pi \cdot r \cdot h$, wherein r=radius of the probe 1. In accordance with FIG. 2, the electrode spacing a is measured between the upper edge of a lower electrode 4, 5, 6 and the lower edge of an upper electrode 13, 4, 5.

Figure 3:
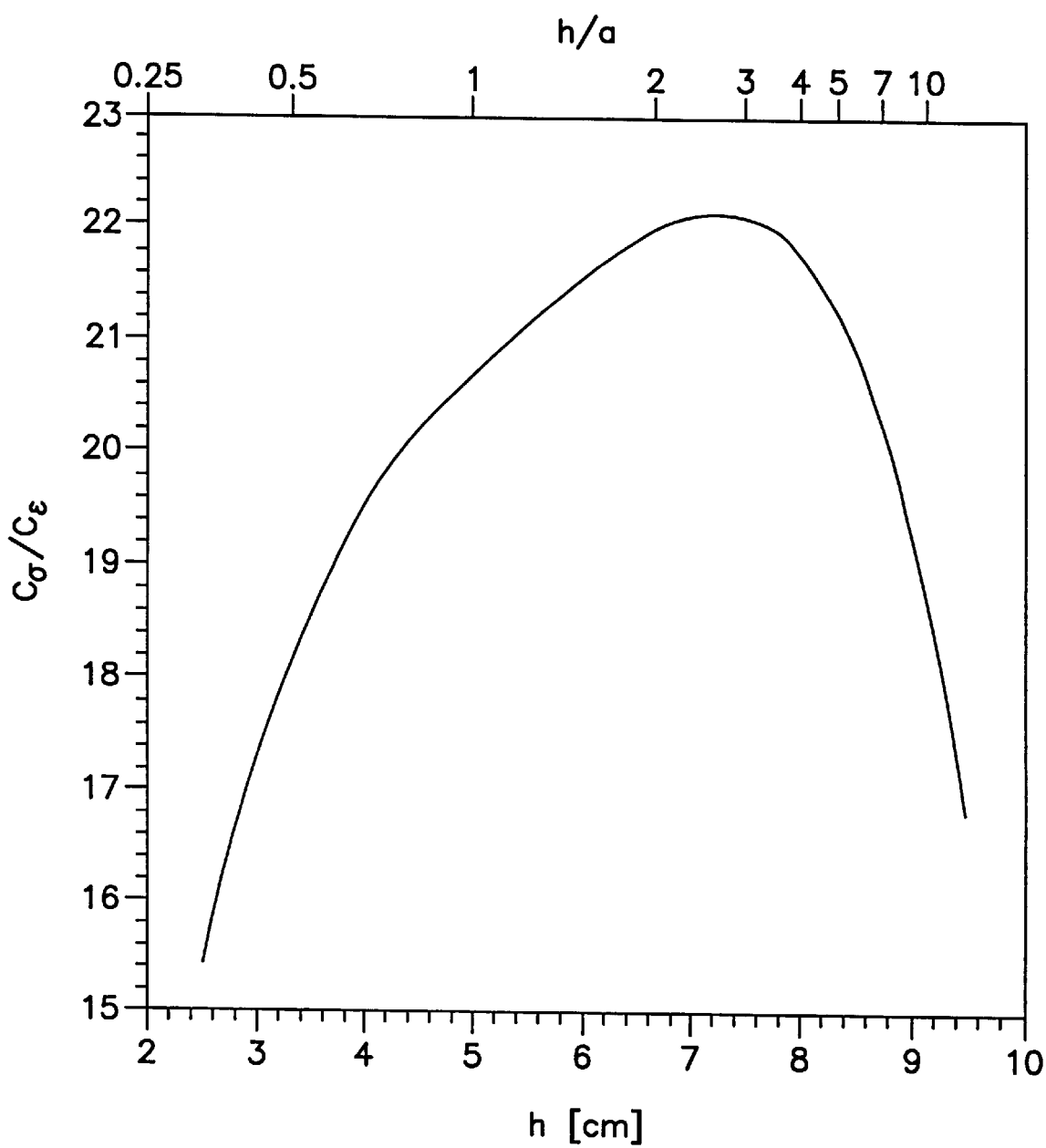
FIG. 3 shows an electrode-pair capacitance ratio $C_o/C_e$ for a conductive medium relative to an insulating one, as a function of the electrode height h.

FIG. 3 shows the result of a numerical simulation of the capacitance ratio $C_o/C_\in$ as a function of the electrode height h and the ratio of the electrode height to electrode spacing h/a. The following assumptions were made for the calculation: probe radius r=5 cm, constant periodicity of the electrode arrangement a+h=10 cm, salt water as medium 10 with $\epsilon_1$=64 and $\rho_1$=0.25 $\Omega$m for determining $C_o$, and oil as medium 11 with $\epsilon_2$=2.2 and $\rho_2$=10$^{11}$ $\Omega$m for determining $C_\in$ and $\epsilon_e \approx \epsilon_2$. Contrary to prior understanding, the capacitance ratio $C_o/C_\in$ is small for small electrode heights h and/or large electrodes spacings a, although it is true that the electric stray field for large a could project further into the media 10, 11 and react with particular sensitivity to variations in the dielectric constant. Instead of this, $C_o/C_\in$ rises with increasing electrode height h, reaches a maximum at approximately h=7.5 cm or h/a=3, and drops steeply thereafter for h→10 cm. The rise is dominated by the increase in the electrode and/or capacitor surface A of the double-layer capacitor $C_{DS}$ in the $C_o$, whereas the drop is dominated by the increase in $C_s$ because of the decreasing electrode spacing a→0. In this exemplary embodiment, $C_o/C_\in$=20.7 for a symmetrical arrangement having an electrode height equal to the electrode spacing, or h/a=1. In particular, $C_o/C_\in$>20.7 for 1<h/a<6, and $C_o/C_\in$=22.2 ($C_o$=378 pF, $C_\in$=17 pF) has a maximum for h/a≈3. Consequently, for a sufficiently large signal excursion 2·$C_o/C_\in$, h/a is advantageously selected to be between 0.5 and 12, preferably between 1 and 6, in particular preferably between 1.5 and 4.5, in particular to be equal to 3.

Figure 4:
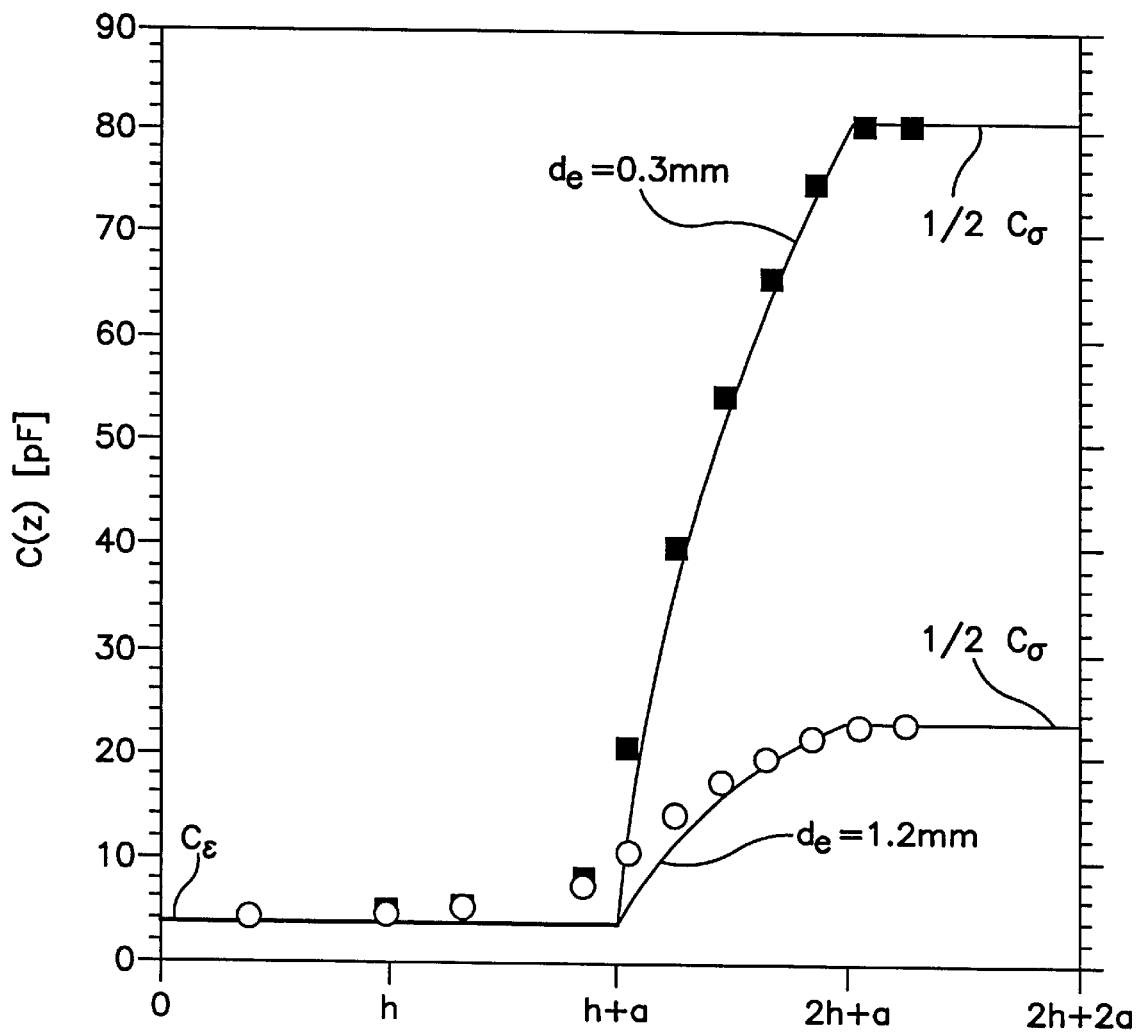
FIG. 4 shows an electrode-pair capacitance C as a function of a liquid level height z for two thicknesses $d_e$ of the electrode cover.

In addition to the selection of a relative electrode height h/a, the optimization of the electrode geometry according to the invention also comprises that of an absolute electrode height h as well as a thickness $d_e$ and dielectric constant $\epsilon_e$ of the electrode cover 7. In FIG. 4, the full lines show analytical calculations, and the points show numerical calculations of electrode-pair capacitance C as a function of the liquid level height z for two thicknesses $d_e$=0.3 mm and $d_e$=1.2 mm of the electrode cover 7. The analytical function C(z) can be approximated according to the invention by the equation $$\begin{aligned} C(z) &= C_\epsilon & \text{for } 0 \leq z \leq h+a & \qquad (G4) \\ &= C_\epsilon + C_\sigma \cdot z/(z+h) & \text{for } h+a \leq z2 \cdot h+a \\ &= C_\sigma/2 & \text{for } 2 \cdot h+a \leq z \leq 2 \cdot (h+a) \end{aligned}$$

where it has been assumed for the sake of simplicity that $C_\in \ll C_o$. According to FIG. 4 and equation G4, the measurement of the electrode-pair capacitance C(z) can be used both for a digital and for an analog display of the location z of the boundary layer 12.

The digital display is firstly discussed with the aid of the electrode pair 4, 5 in FIG. 2. The capacitance C(z) is largely constant for 0≤z≤h+a. It jumps from $C_s$ to the value $C_o/2$ when the boundary layer 12 rises from z=h+a to z=2·h+a, and maintains the essentially constant value of $C_o/2$ between z=2·h+a and z=2·(h+a). This appears to mean that for z<0 a purely geometric capacitance $C_\in$ is present in a dielectric 11, and that for z>2·h+a two double-layer capacitors $C_{DS}$ are present on the electrodes 5 and 4 dipped completely into the conductive medium 10. The numerical solution shows that C(z) rises slightly between 0 and h+a, and that the rise of C(z) increases continuously in the region of z=h+a. Both solutions show that the preferred measuring range is in the region of the large rise in capacitance between h+a and 2·h+a. Consequently, for an optimum sensor operation it is preferred to use that electrode pair capacitor C(z) for which the lower electrode is dipped completely, and the upper electrode is dipped partially, into the conductive medium 10.

One advantage of the digital display is that, depending on the required signal-to-noise ratio and the type of the media 10, 11, the signal excursion 2·$C_o/C_\in$ can be adapted and, in particular, optimized by a suitable selection of the relative electrode height h/a in accordance with FIG. 3. A further advantage consists in that it is possible to achieve a sufficient and reliable height resolution h+a≈5 cm to 10 cm for separator tanks by selecting the period length h+a of the electrode arrangement 4, 5, 6, 13 appropriately.

A very fine height resolution can be realized, moreover, with the aid of an analog display. It is possible for this purpose to determine a liquid level height z of the boundary layer 12 with the aid of equation G4 from the analog measuring signal C(z) in the range of h+a≤z≤2·h+a (or 2·h+2·a≤z≤3·h+2·a, etc.). The measuring range h+a≤z≤2·h+a useful for a given electrode pair 5, 4 is characterized in that the boundary layer 12 overlaps precisely the electrode 4 and varies the dominant double-layer capacitance $C_{DS}$ there. By contrast, a dead region h≤z≤h+a exists between the electrodes 5, 4. Consequently, for a liquid level sensor operated in an analog fashion, the aim is to select the absolute electrode height h to be as large as possible and to select the relative electrode height h/a in a range with a sufficiently large signal excursion 2·$C_o/C_\in$ in accordance with FIG. 3. This means that h/a is selected according to the invention to be larger than 1 and preferably smaller than 12. One advantage of the invention therefore consists in that the measuring probe 1, in particular the relative electrode height h/a, can be optimized simultaneously for a digital and an analog display.

A continuous analog measuring range can also be realized by means of two independent measuring probes 1 which are arranged offset relative to one another and have overlapping, or at least complementary, measuring ranges. In the simplest case, the probes 1 are identical and further have a ratio of electrode height to electrode spacing h/a which is larger than 1.

It can be seen, furthermore, from FIG. 4 and equations G1 and G2 that the electrode cover 7 is to be as thin as possible in order to obtain a large double-layer capacitor $C_{DS}$ and a large signal excursion $2 \cdot C_o/C_\in$. The cover 7 advantageously has a thickness $d_e$ of less than 2.5 mm, preferably of less than 1.5 mm and, in particular, of less than 1 mm. The cover 7 acts as a dielectric shield for the E field in the outside, and thereby prevents the formation of the double-layer capacitor $C_{DS}$. The cover 7 advantageously has a dielectric constant $\in_e$ which is smaller than 10 and, in particular, smaller than 5.

The above considerations relate to a boundary layer 12 between an ion conductor or electrolyte 10 and an insulator 11. During the calculations, the frequency f of the capacitance measurement was set equal to zero. However, the results retain their validity if the capacitance measurement is carried out using AC voltage of the frequency $$f < \tau_1^{-1} \approx (K \cdot \in_e \cdot \in_0 \cdot \rho_1)^{-1} = f_1 \quad (G5)$$

instead of using DC voltage. The dielectric cut-off frequency $f_1$ is typically 1 GHz for salt water.

The electrode optimization according to the invention likewise retains its validity when the aim is to determine the location of a boundary layer 12 between two conductive media 10, 11 of different resistivities $\rho_1 \ll \rho_2$. According to equation G5, the media 10, 11 separated by the boundary layer 12 then have different dielectric cut-off frequencies $f_1 = (K \cdot \in_e \cdot \in_0 \rho_1)^{-1}$ and $f_2 = (K \cdot \in_e \cdot \in_0 \rho_2)^{-1}$, and the frequency of the capacitance measurement or measuring frequency f can be selected to be between the cut-off frequencies $f_2$ and $f_1$, that is to say in the frequency range of $$f_2 \ll f \ll f_1 \quad (G6).$$

The conductive medium 10 is then capable of forming a double-layer capacitor $C_{DS}$, whereas in the less conductive medium 11 only the geometric capacitance $C_\in$ is active. It holds for oil 11 that $f_2 \ll 1$ Hz.

The shape of the electrodes 4, 5, 6, 13 is not limited to the abovementioned rectangular one. In principle, the electrodes 4, 5, 6, 13 can also have a shape of a trapeze, triangle, inter alia in the rolled-out state. The rules for the electrode optimization remain largely unchanged qualitatively when the electrode height h and the electrode spacing a are replaced by average or root-mean-square values $h_{eff}$ and $a_{eff}$.

A further subject matter of the invention is to ensure reliable capacitance measurement or determination of liquid level even in the case of the presence of a conductive or electrically insulating dirt film 14 on the rod surface 15.

Figure 5:
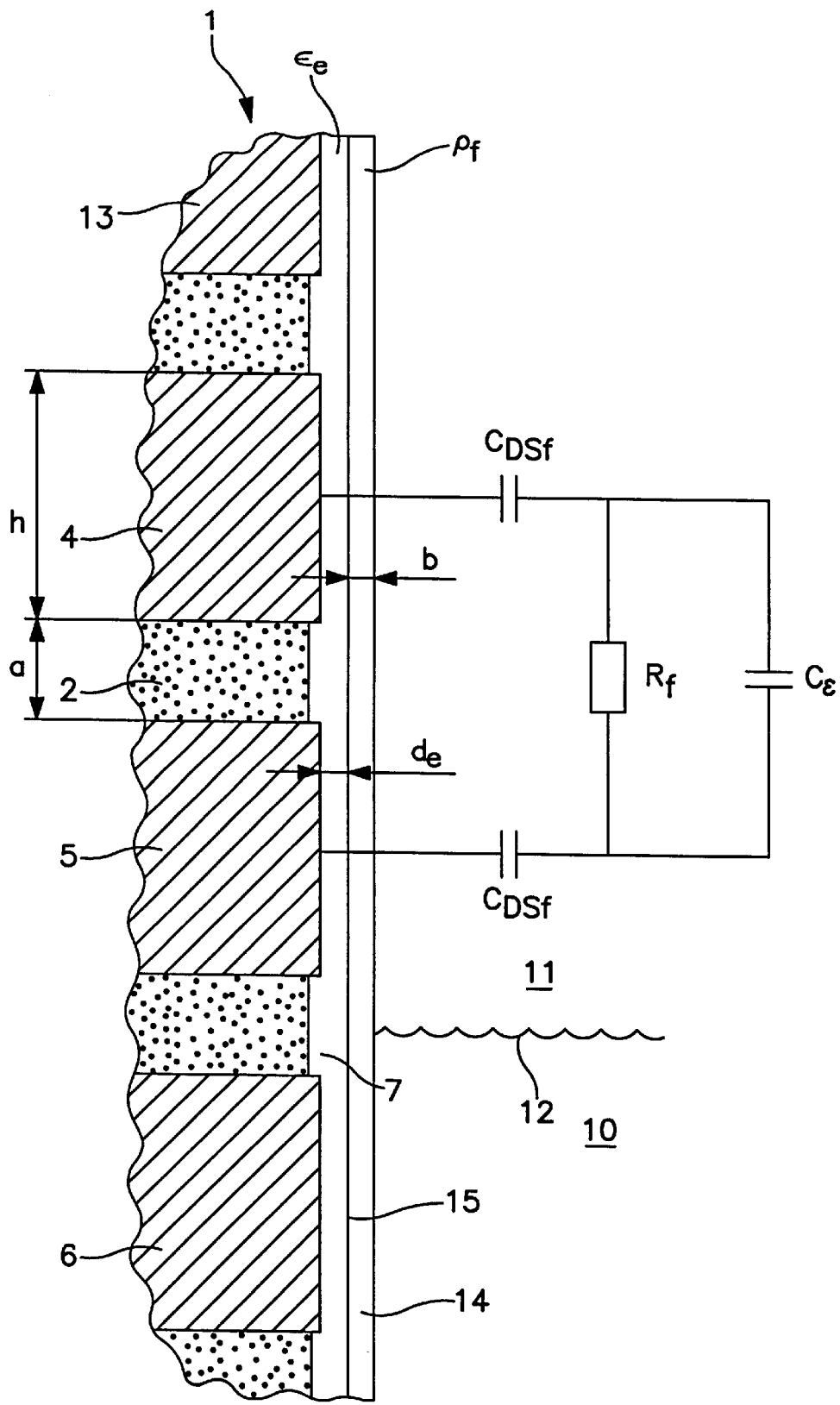
FIG. 5 shows a detail of the measuring probe having a conductive dirt film and an associated equivalent circuit diagram for the for the impedance between an electrode pair.

FIG. 5 shows a detail of a measuring probe 1 which is covered by a more or less conductive dirt film 14 of thickness b and resistivity $\rho_f$, and is dipped into an insulating medium 11. For example, the dirt film 14 can consist of water or a water-oil emulsion. On the one hand, the film 14 contributes to the geometric capacitance $C_\in$ in the medium 11 with the aid of two double-layer capacitors $C_{DSf}$ in accordance with equation G2

$$C_{DSf} = \in_e \cdot \in_0 \cdot 2 \cdot \pi \cdot r \cdot h/d_e \quad (G7),$$

an electrode in the shape of a ring having been assumed for the sake of simplicity. On the other hand, the film 14 acts as an electric conductor parallel to $C_\in$ at the resistance $$R_f = h_f \cdot \rho_f/(2 \cdot \pi \cdot r \cdot b) \quad (G8),$$

$h_f$ denoting the effective length of the path of conductivity between two electrodes 4, 5. It is possible for $h_f$ to be set equal to a +h/2 or equal to h by way of approximation. The characteristic RC time constant of the film 14

$$\tau_f = R_f \cdot C_{DSf}/2 = \tau_{f0} \cdot G \quad (G9)$$

is composed of a material-specific time constant $$\tau_{f0} = \in_s \cdot \in_0 \cdot \rho_f \quad (G10)$$

and a dimensionless geometry factor determined by the layer $$G = h \cdot h_f/(2 \cdot d_e \cdot b) \approx h^2/(2 \cdot d_e \cdot b) \quad (G11).$$

The relaxation time $\tau_f$ defines a characteristic frequency of the dirt film 14

$$f(b) = \tau_f^{-1} = 2 \cdot (\in_e \cdot \in_0 \cdot \rho_f)^{-1} \cdot (d_e/h^2) \cdot b \quad (G12)$$

which depends, in particular, on the thickness b of the conductive dirt film 14. Below or above the characteristic frequency f(b), the total electrode-pair capacitance asymptotically assumes the values $$\begin{aligned} C(f) &= C_{DSf}/2 \quad \text{for } f < f(b) \\ &= C_\varepsilon \quad \text{for } f > f(b) \end{aligned} \quad (G13)$$

At low frequencies f<f(b), the dirt film 14 can simulate a conductive medium 10, although an insulating medium 11 is hidden behind the film 14. By contrast, in the case of high frequencies f>f(b), the dirt film 14 appears dielectrically transparent. Consequently, the measuring frequency f is advantageously selected to be higher than f(b). A quantitative example of this: $\rho_f = 0.25$ $\Omega$m (salt water-dirt film 14), $\in_e \approx 3$, $\tau_{f0} \approx 7$ ps; $h \approx h_f \approx 15$ mm, $d_e = 0.5$ mm b=1 mm, geometry factor $G \approx 200 \rightarrow f(b) = 100$ MHz. Note that the conductivity of the water varies strongly with the temperature-dependant and pressure-dependant salt content, something which can be taken into account by a suitable selection of frequency. If the dirt film 14 consists of an emulsion of salt water of concentration c and oil of concentration 1−c, it is possible to approximate $\rho_f = \rho_{salt\ water}^c \cdot \rho_{oil}^{1-c}$, and the characteristic frequency f(b) drops accordingly. For an arbitrary medium 10 of concentration c and medium 11 of concentration 1−c, it is permissible to set $\rho_f = \rho_1^c \cdot \rho_2^{1-c}$.

Two exemplary embodiments are specified below as to how it is possible to measure the liquid level in a simple way in conjunction with a variable film thickness b. Firstly, it is possible to prescribe a maximum permissible film thickness $b_c$ and an associated critical frequency $f_c$, and to select a measuring frequency above $f_c$ $$f > f_c = f(b_c) = 2 \cdot (\in_e \cdot \in_0 \cdot \rho f)^{-1} \cdot (d_e/h^2) \cdot b_c \quad (G14).$$

The observance of a film thickness of $b < b_c$ can then be ensured, for example, by virtue of the fact that appropriate cleaning intervals are fixed in conjunction with an approximately known soiling rate. Secondly, it is possible to prescribe a maximum permissible film thickness $b_c$ and an associated critical frequency $f_c$ and to select two measuring frequencies above and below $f_c$ respectively, $$f_a < f_c = f(b_c) \text{ and } f_b > f_c = f(b_c) \quad (G15).$$

As the current film thickness b approaches the critical value $b_c$, the capacitance value $C(f_a)$ measured at the lower frequency will then firstly drop, and the capacitance value $C(f_b)$ measured at the higher frequency will remain constant. With the aid of such a signal signature, it is possible, for example, to control the quantity of an inhibitor additive for the chemical dissolution of the dirt film 14, to cause cleaning of the measuring rod 1 by means of an axially movable ring, or to take other suitable measures.

A great advantage of eliminating a conductive dirt film 14 in this way by measurement technology consists in that the selection of the measuring frequency/frequencies using equation G14 or G15 is effectively compatible with the optimization of the electrode height h and the selection of the measuring frequency using equation G6. Specifically, in general a critical frequency $f_c$ is given or can be selected for the media 10, 11 and a dirt film 14 such that $f_2<f_c<f_1$ is fulfilled. In particular, it virtually always holds that $$f_c/f_1=(\rho_1/\rho_f)\cdot G^{-1}<1 \tag{G16}$$

since it is typically the case that $\rho_1 \leq \rho_f$ and $G^{-1}=(2\cdot d_e \cdot b)/h^2 \approx 10^{-2} \ldots 10^{-3}$. It is then possible to select a measuring frequency in the frequency range of $f_c<f<f_1$ for which the dirt film 14, but not the conductive medium 10 is transparent. In addition, the electrode height h is selected to be large, and the thickness $d_e$ of the cover 7 is selected to be small in an advantageous fashion in complete agreement with the electrode optimization according to the invention, in order to render the geometry factor G as large as possible and the critical frequency fc of the dirt film 14 as small as possible.

Figure 6A:
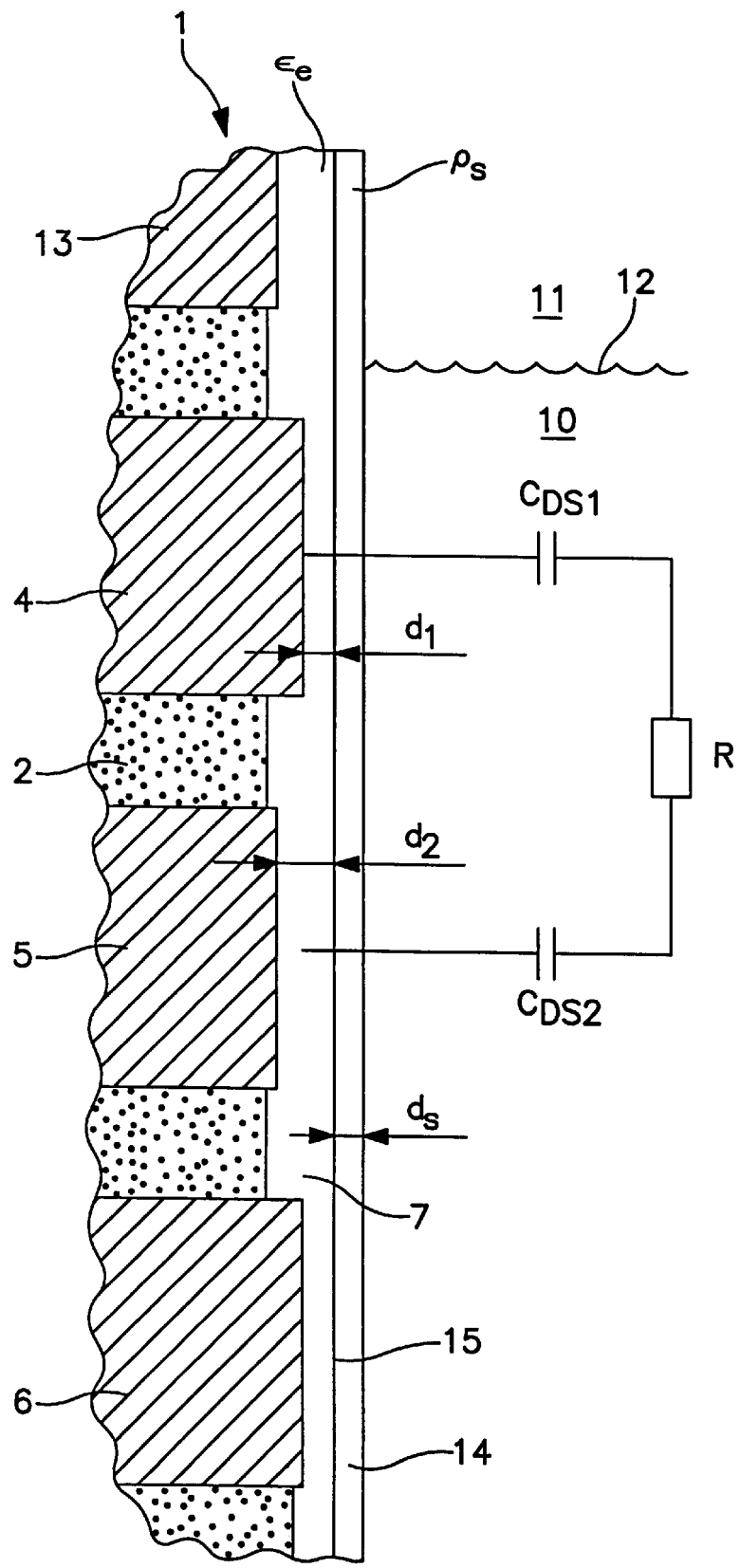
FIGS. 6a, 6b each show details of a measuring probe having radially offset electrodes for the purpose of detecting an insulating dirt film, and an associated equivalent circuit diagram for the impedance between an electrode pair.
Figure 6B:
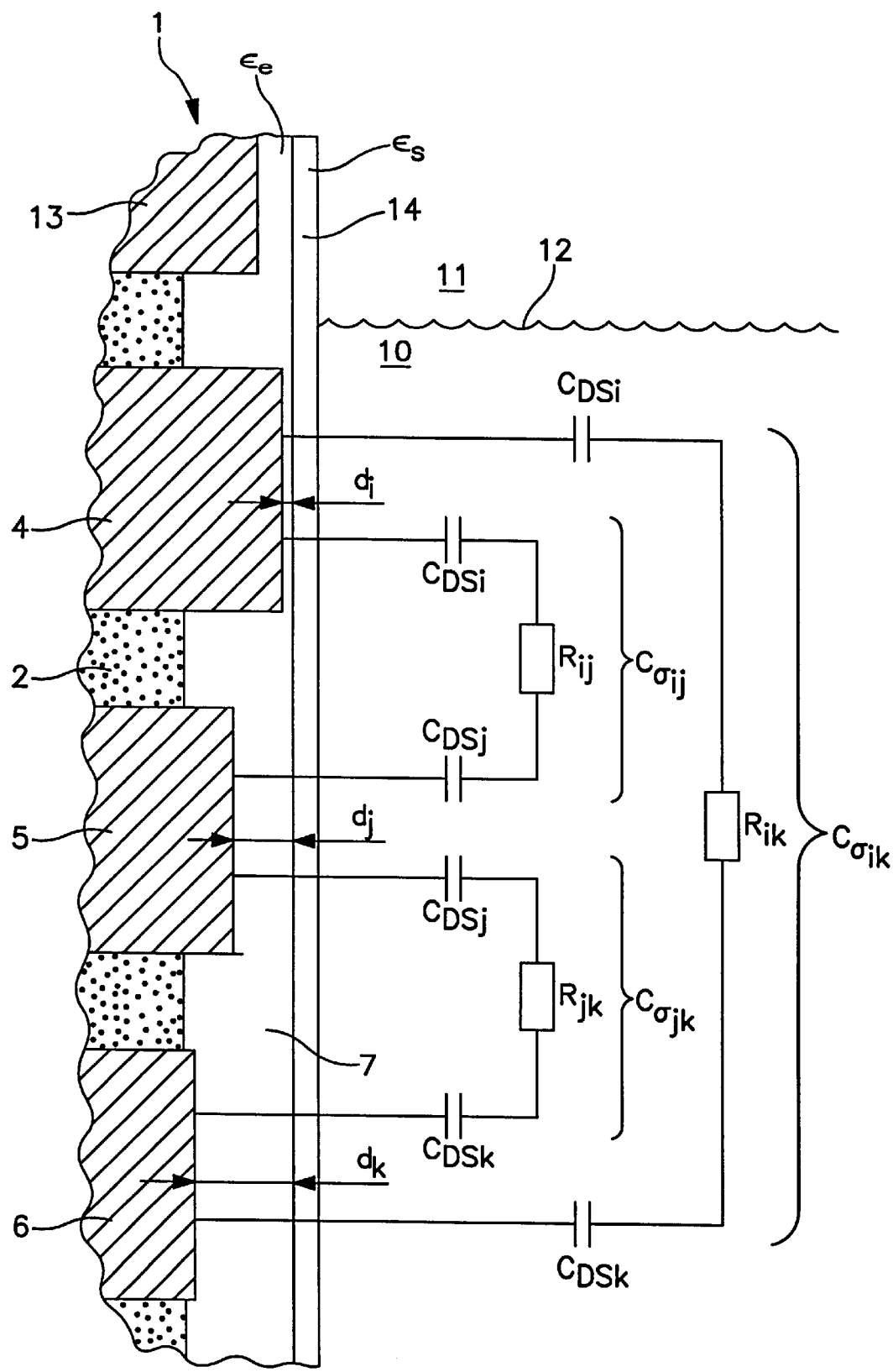

FIGS. 6a, 6b show exemplary embodiments of an electrode arrangement 4, 5, 6, 13 which is particularly suitable for capacitive liquid level measurement in the presence of an insulating dirt film 14. The idea according to the invention consists in that the probe 1 has electrodes 4, 5, 6, 13 with covers 7 of different thicknesses $d_i$. The electrodes 4, 5, 6 may be denoted below as the ith, jth and kth electrode with the associated cover thicknesses $d_i$, $d_j$ and $d_k$ and capacitor surfaces $A_i$, $A_j$ and $A_k$, i, j, k=1, 2, ... n being indices for enumerating the electrodes, and n being the total number of electrodes 4, 5, 6, 13. In the case of $d_i \neq d_j$, different double-layer capacitors having capacitances $C_{DSi} \neq C_{DSj}$ occur in a conductive medium 10 upstream of the ith and jth electrode 4, 5, and vary to a different extent with the effective thickness $d_s/\in_s$ of the insulating dirt film 14, wherein $d_s$=geometrical thickness and $\in_g$=dielectric constant of the film 14. By analogy with equation G2, it holds, specifically, for the values of the double-layer capacitances falsified by the film 14 that $$C_{DSi}=\in_0\cdot A_i/(d_i/\in_c+d_s/\in_s) \tag{G17}$$

$$C_{DSj}=\in_0\cdot A_j/(d_j/\in_c+d_s/\in_s) \tag{G18}$$

According to the invention, the effective thickness of the film 14

$$d_s/\in_s=(d_i/\in_e)\cdot[(C_{DSj}\cdot d_j\cdot A_i)/(C_{DSi}\cdot d_i\cdot A_j)-1]/[1-C_{DSj}\cdot A_i/C_{DSi}\cdot A_j] \tag{G19}$$

can be determined therefrom, and this is simplified for equal capacitor surfaces $A_i=A_j=A$ $$d_s/\in_s=(d_i/\in_e)\cdot[(C_{DSj}\cdot d_j)/(C_{DSi}\cdot d_i)-1]/[1-C_{DSj}/C_{DSi}] \tag{G20}$$

The quotient of the double-layer capacitances $C_{DSj}/C_{DSi}$ in equation G19 or G20 can be determined by capacitance measurements between a plurality of electrodes 4, 5, 6, 13. Neighboring electrodes 13, 4; 4, 5; 5, 6 advantageously have different thicknesses $d_i \neq d_j$ (j=i+1) of the cover 7, and electrodes 13, 5 and 4, 6 which are next but one relative to each other have equal thicknesses $d_i=d_k$ (k=i+2). The capacitance values between electrodes 4, 6 and 13, 5 next but one relative to each other which are measured in the presence of the film 14 are then equal $C_{oi}=C_{DSi}/2$ and $C_{oj}=C_{DSj}/2$, for small frequencies, and it holds that $$C_{DSj}/C_{DSi}=C_{oj}/C_{oi} \tag{G21}$$

FIG. 6b shows a general case of different cover thicknesses $d_i \neq d_j \neq d_k$ over the electrodes 4, 5, 6. It then holds that $$C_{DSj}/C_{DSi}=(C_{oij}^{-1}+C_{oik}^{-1}-C_{ojk}^{-1})/(C_{oij}^{-1}+C_{ojk}^{-1}-C_{oik}^{-1}) \tag{G22},$$

where $C_{oij}^{-1}=C_{DSi}^{-1}+C_{DSj}^{-1}$ etc. denote the total capacitances, which can be measured, in a frequency-selective fashion if appropriate, between the ith and jth etc. electrode.

Thus, in principle, the thicknesses $d_i$ of the cover 7 can be selected at will if neighboring electrodes 13, 4; 4, 5; 5, 6, that is to say ones belonging to an electrode pair capacitor C, have different thicknesses $d_i \neq d_{i+1}$. Different thicknesses $d_i \neq d_{i+1}$ can also be realized for electrodes 4, 5, 6, 13 having the same cross section, in particular the same radius, by virtue of the fact that the surface 15 of the probe 1 has step-shaped, in particular annular elevations with different step heights over neighboring electrodes 13, 4; 4, 5; 5, 6. The corresponding values of the associated capacitor surfaces $A_i$ and $A_j$ are then to be inserted into equations G17–G19. As may be seen from FIG. 6a, the surface 15 of the probe 1 is preferably a circular cylinder, the electrodes 4, 5, 6, 13 are in the shape of a ring and their capacitor surfaces are equal $A_i=A_j$, and neighboring electrodes 13, 4; 4, 5; 5, 6 have different thicknesses $d_i \neq d_{i+1}$ and electrodes 13, 5; 4, 6 next but one relative to each other have the same thicknesses $d_i=d_{i+2}$ of the cover 7.

The effective thickness $d_s/\in_s$, determined with the aid of equations G20 or G21, of a dielectric dirt film 14 can be used in a different way to monitor and correct the liquid level measurement. For example, it is possible to determine non-falsified values of the double-layer capacitances and the total capacitance $C_O$ by computational elimination of the $d_s/\in_s$ in equations G17–G20. Moreover, it is possible, in turn, to take suitable measures as soon as $d_s/\in_s$ overshoots a prescribable critical value. These comprise, in particular, required or periodic cleaning of the measuring probe 1, controlling a quantity of inhibitor, or the like.

The variation in the cover thickness $d_i$ for the purpose of detecting an insulating dirt film 14 has several advantages. Radially offsetting the electrodes 4, 5, 6, 13 can be combined, without a problem, with optimizing the electrode height h, but also with selecting the measuring frequency by using equations G6 or G14, G15. In particular, it is possible to retain the large surface and vertical orientation of the electrodes 4, 5, 6, 13, as a result of which the capacitance ratio $C_O/C_\in$ becomes especially large. In addition, as mentioned at the beginning, there are in principle no restrictions relating to the cross section of the probe 1. If appropriate, geometric variables such as, for example, the electrode height h, the capacitor surfaces $A_i$, the thicknesses $d_i$ of the cover 7 or the film thicknesses b, $b_c$ and $d_s$, are to be replaced in equations G7–G21 by average or root-mean-square values.

The tube 2 consists of a dielectric such as plastic, plexiglass, PVC, glass, ceramic or the like. The tube interior 3 with the measuring lines 8 and sheaths 9 is advantageously sealed with an epoxy resin. This ensures stable basic capacitances and renders the probe 1 resistant to high pressure. The electrode cover 7 consists, for example, of a castable coating of epoxy resin or of glass, a ceramic, mica or the like, and is, in particular, fiber-reinforced. The electrode cover 7 preferably comprises a thin (approximately 0.5 mm . . . 1 mm), stable glass fiber sheath which is coated with epoxy resin. It is preferred to use materials with similar coefficients of thermal expansion in order to provide the probe 1 with good mechanical thermal endurance.

Overall, the invention discloses a capacitive measuring probe 1 which is distinguished by large-surface electrodes 4, 5, 6, 13 which are relatively closely spaced and preferably radially offset, and is to be operated at frequencies which are matched to the conductivity of the media 10, 11 and of a dirt film 14. The probe 1 is therefore very well suited for accurate liquid level measurement in the presence of arbitrary dirt films 14.

Obviously, numerous modifications and variations of the present invention are possible in light of the above teachings. It is therefore to be understood that within the scope of the appended claims, the invention may be practiced otherwise than as specifically described herein.

LIST OF DESIGNATIONS

| | |
|---|---|
| 1 | Capacitive measuring probe, measuring rod |
| 2 | Tube |
| 2b | Lateral surface |
| 3 | Tube interior |
| 4, 5, 6, 13 | Electrodes |
| 5a, 5b | Segment-shaped electrodes |
| 7 | Electrode cover |
| 8 | Measuring lines |
| 9 | Sheath |
| 10 | Water, conductive medium |
| 11 | Oil, insulating (less conductive) medium |
| 12 | Boundary layer |
| 14 | Dirt film |
| 15 | Surface of the measuring probe |
| a | Electrode spacing |
| h | Electrode height |
| $d_e, d_1, d_2, d_j, d_{j+1}, d_{j+2}$ | Thickness of the electrode cover |
| $d_g$ | Thickness of a dielectric dirt film |
| $b_c$ | Thickness of a conductive dirt film |
| f | Frequency of the capacitance measurement |
| $f_1, f_2$ | Cut-off frequencies of the dielectric relaxation of the media 10, 11 |
| $f_c$ | Cut-off frequency of the dielectric relaxation of the dirt film |
| r | Radius of the measuring probe |
| z | Height of liquid level, spatial coordinate of a boundary layer |
| $\epsilon_0$ | Influence constant |
| $\epsilon_M$ | Dielectric constant of a medium |
| $\epsilon_\epsilon$ | Dielectric constant of the electrode cover |
| $\epsilon_S$ | Dielectric constant of the dirt film |
| $\rho_f$ | Resistivity of the dirt film |
| $\rho_M$ | Resistivity of a medium |
| $\tau, \tau_1, \tau_2$ | Dielectric relaxation time constants of a medium |
| $\tau_f, \tau_{f0}$ | Dielectric relaxation time constant of the dirt film |
| $\omega$ | Angular frequency of the capacitance measurement |
| $A, A_j, A_{j+1}$ | Double-layer capacitor surfaces |
| B | Probe axis |
| $C_{DS}, C_{DS1}, C_{DS2}$ | Double-layer capacitors |
| $C_{DSf}$ | Double-layer capacitor of a conductive dirt film |
| $C_\epsilon$ | Electrode-pair capacitance for an insulating medium |
| $C_\sigma, C_{\sigma S}$ | Electrode-pair capacitance for a conductive medium |
| C(z), C | Total capacitance, electrode-pair capacitance |
| G | Geometry factor |
| $R, R_{ij}, R_{ik}, R_{jk}$ | Resistances in the conductive medium |

What is claimed is:

1. A capacitive liquid level sensor, suitable in particular for determining the location of a boundary layer between water and oil in a separator tank, comprising:

a rod-shaped probe having a plurality of electrodes arranged along a probe axis, between which capacitances dependent on liquid level are measured, the electrodes being provided with an electrically insulating cover, wherein for each of the plurality of electrodes, a ratio of a height of the electrode to a spacing of the electrode is larger than one, the electrode height being the width of the electrode in the direction of an axis of the probe, and the electrode spacing being a spacing between neighboring edges of the electrode and an adjacent another one of the plurality of electrodes.

2. The capacitive liquid level sensor as claimed in claim 1, wherein the ratio of the height to the spacing is in the range of 1 to 6.

3. The capacitive liquid level sensor as claimed in claim 2, wherein
   a) the cover has a thickness ($d_e$) of less than 2.5 mm, and
   b) the cover has a dielectric constant ($\epsilon_e$) of less than 10.

4. The capacitive liquid level sensor as claimed in claim 1, wherein the electrodes have covers of different thicknesses ($d_j$).

5. The capacitive liquid level sensor as claimed in claim 4, wherein
   a) the electrodes have identical double-layer capacitor surfaces,
   b) adjacent ones of the plurality of electrodes have different thicknesses of the cover, and each pair of the plurality of electrodes which is separated by a single one of the plurality of electrodes has identical thicknesses of the cover and
   c) an effective thickness ($d_s/\epsilon_s$) of an insulating dirt film can be determined in accordance with $(d_s/\epsilon_s)=(d_i/\epsilon_e)\cdot[(C_{DSj}\cdot d_j)/(C_{DSi}\cdot d_i)-1]/[1-C_{DSj}/C_{DSi}]$, where $\epsilon_e$=dielectric constant of the covers, and $d_i$, $d_j$=thicknesses of the cover and $C_{DSi}$, $C_{DSj}$=double-layer capacitors of an i-th, j-th electrode.

6. The capacitive liquid level sensor as claimed in claim 5, wherein
   a) the probe comprises a cylindrical tube on whose lateral surface the plurality of electrodes is mounted, and
   b) the interior of the cylindrical tube is sealed with respect to the outside surrounding the probe.

7. The capacitive liquid level sensor as claimed in claim 6, wherein
   a) the cylindrical tube is a circular cylinder, and
   b) each of the electrodes is in the shape of a ring.

8. The capacitive liquid level sensor as claimed in claim 7, wherein
   a) the cylindrical tube consists of a dielectric.

9. The capacitive liquid level sensor as claimed in claim 1, wherein the ratio of the height to the spacing is preferably between 1.5 and 4.5.

10. The capacitive liquid level sensor as claimed in claim 1, wherein the ratio of the height to the spacing is equal to 3.

11. The capacitive liquid level sensor as claimed in claim 2, where
   a) the cover has a thickness ($d_e$) of less than 1.5 mm, and
   b) the cover has a dielectric constant ($\epsilon_e$) of less than 5.

12. The capacitive liquid level sensor as claimed in claim 2, where the cover has a thickness ($d_e$) of less than 1.0 mm.

13. The capacitive liquid level sensor as claimed in claim 6, wherein
   a) the cylindrical tube is a circular cylinder, and
   b) each of the electrodes has a rectangular shape when in a rolled-out state.

14. The capacitive liquid level sensor as claimed in claim 8, wherein the cylindrical tube consists of one of plastic, glass and ceramic.

15. The capacitive liquid level sensor as claimed in claim 8, wherein the cover of electrodes comprises epoxy resin.

16. The capacitive liquid level sensor as claimed in claim 8, wherein the cover of electrodes comprises glass ceramic.

17. The capacitive liquid level sensor as claimed in claim 8, wherein the cover of electrodes comprises mica.

18. The capacitive liquid level sensor as claimed in claim 8, wherein the cover of electrodes is fiber-reinforced.

* * * * *